United States Patent
Kosugi

(10) Patent No.: US 8,504,347 B2
(45) Date of Patent: Aug. 6, 2013

(54) SIMULATION APPARATUS, SIMULATION METHOD, AND PROGRAM TO PERFORM SIMULATION ON DESIGN DATA OF A TARGET CIRCUIT

(75) Inventor: Naoto Kosugi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 577 days.

(21) Appl. No.: 12/405,617

(22) Filed: Mar. 17, 2009

(65) Prior Publication Data

US 2009/0240484 A1    Sep. 24, 2009

(30) Foreign Application Priority Data

Mar. 21, 2008 (JP) ................. 2008-074077

(51) Int. Cl.
*G06F 17/50* (2006.01)
*G06F 9/455* (2006.01)

(52) U.S. Cl.
USPC ............................................. 703/16; 703/23

(58) Field of Classification Search
USPC ................ 703/15, 16, 23; 713/400, 500
See application file for complete search history.

(56) References Cited

U.S. PATENT DOCUMENTS

| | | | | |
|---|---|---|---|---|
| 5,751,592 A | * | 5/1998 | Takai et al. | 716/106 |
| 6,053,949 A | * | 4/2000 | Takai et al. | 703/15 |
| 7,031,897 B1 | * | 4/2006 | Blomgren et al. | 703/14 |
| 2009/0070619 A1 | | 3/2009 | Gotoh | |

FOREIGN PATENT DOCUMENTS

| | | |
|---|---|---|
| JP | 2001-273351 A | 10/2001 |
| JP | 2006-318121 A | 11/2006 |
| WO | WO 2007/142201 A1 | 12/2007 |

OTHER PUBLICATIONS

Office Action issued to JP Application No. 2008-074077, issued Mar. 27, 2012.

* cited by examiner

*Primary Examiner* — Kamini S Shah
*Assistant Examiner* — Juan Ochoa
(74) *Attorney, Agent, or Firm* — Arent Fox LLP

(57) ABSTRACT

A simulation apparatus that performs simulation of design data of a verification target circuit including a logic circuit that operates as a multi-cycle path of N cycles in synchronization with a clock signal, the simulation apparatus includes a design data generation section that generates design data of a multi-cycle verification circuit for selectively providing an undefined value signal in place of a signal in a multi-cycle part in the verification target circuit; a logical simulation section that performs logical simulation, without delay, on the basis of design data of the verification target circuit and the design data of the multi-cycle verification circuit; and a comparison section that compares the signal of the verification target circuit with a signal of an expected value in the verification target circuit in the logical simulation.

4 Claims, 14 Drawing Sheets

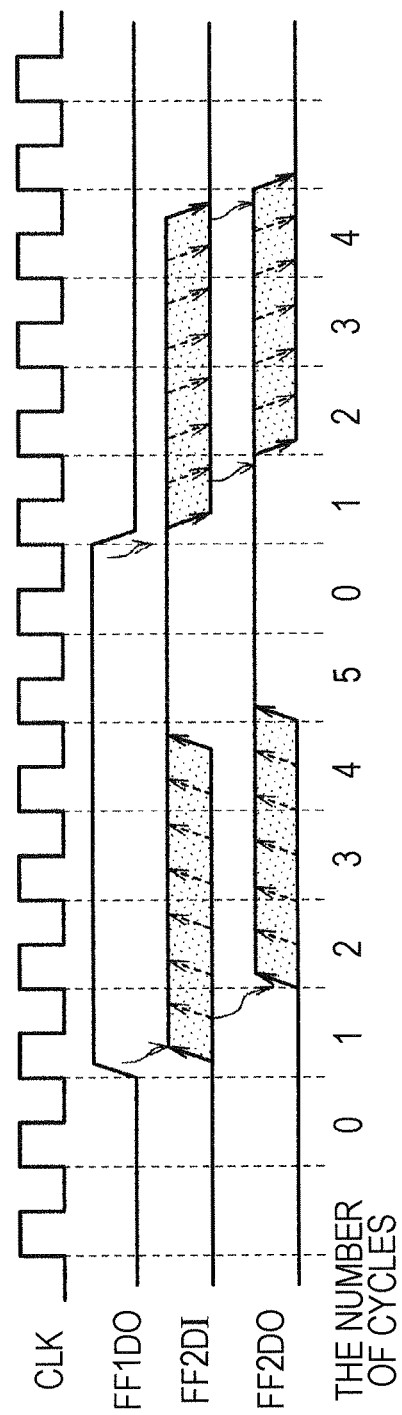

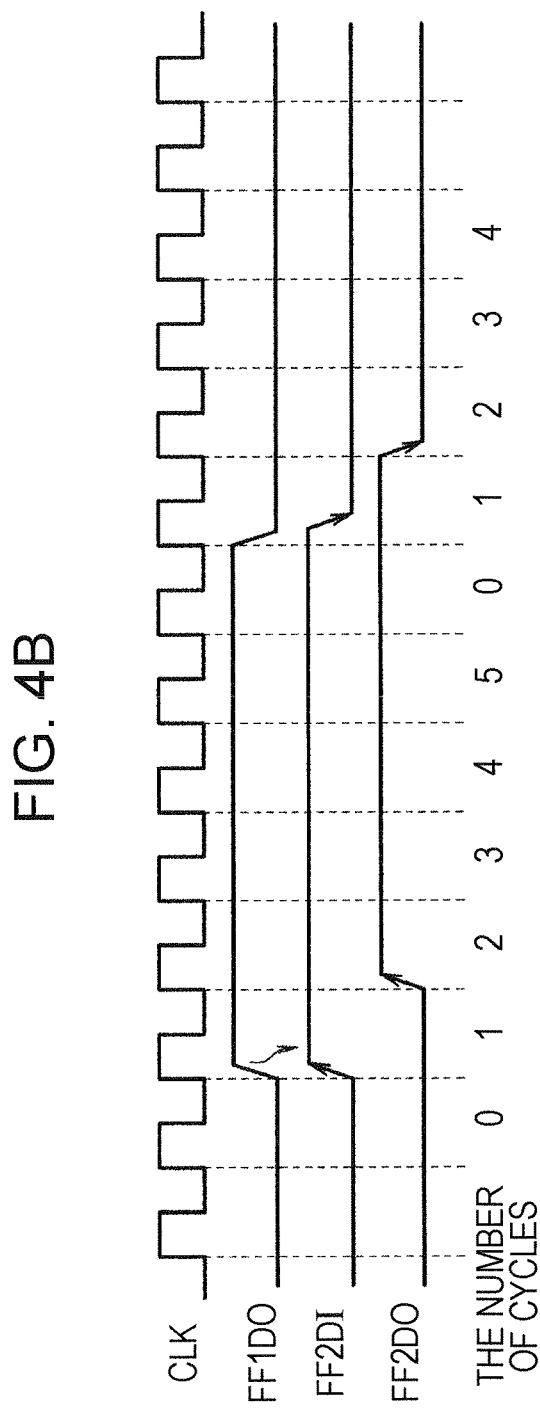

US 8,504,347 B2

SIMULATION APPARATUS, SIMULATION METHOD, AND PROGRAM TO PERFORM SIMULATION ON DESIGN DATA OF A TARGET CIRCUIT

CROSS REFERENCES TO RELATED APPLICATIONS

This application is based upon and claims the benefit of priority from the prior Japanese Patent Application No. 2008-74077 filed on Mar. 21, 2008, the entire contents of which are incorporated herein by reference.

BACKGROUND

1. Field

Aspects in accordance with the present invention relate to a simulation apparatus, a simulation method, and a program.

2. Description of the Related Art

FIG. 2 illustrates a test bench for simulating a clock synchronization logic circuit that includes two flip-flops 103 and 104 and a combinational circuit 112 connected between the flip-flops. A test bench 101 is a system that includes a verification target circuit 102 and a test description.

A simple example of the verification target circuit 102 is described using the clock synchronization logic circuit including the two flip-flops 103 and 104 and the combinational circuit 112 connected between the flip-flops. Such a clock synchronization logic circuit is commonly used in semiconductor integrated circuits.

FIG. 3 is a timing chart illustrating an examplary operation of the verification target circuit 102. The number of cycles denotes the number of cycles of a clock signal CLK. In a cycle 1, the first flip-flop 103 holds data input into an input terminal DI in synchronization with a rise of the clock signal CLK, and outputs data FF1DO from an output terminal DO. The data FF1DO, in the cycle 1, reaches an input terminal DI of the second flip-flop 104 as data FF2DI via the combinational circuit 112. That is, in the one cycle, the output data FF1DO of the first flip-flop 103 reaches the input terminal DI of the second flip-flop 104 as the data FF2DI. Such a circuit is referred to as a single cycle path. In the single cycle path, data delay between the flip-flop 103 and the flip-flop 104 is within one cycle.

In a cycle 2, when a write-enable signal FF2WE is at a high level, the second flip-flop 104 holds the data FF2DI input into the input terminal DI in synchronization with a rise of the clock signal CLK, and outputs data FF2DO from an output terminal DO. The second flip-flop 104, when the write-enable signal FF2WE is at a low level, holds the data without writing the data, and outputs the held data from the output terminal DO as the data FF2DO.

In the verification target circuit 102, if data delay is within N cycles at a maximum, any delay may be permitted. Such a state is referred to as a multi-cycle path. Here, N is a natural number more than one.

FIG. 4A is a timing chart for a situation where the verification target circuit 102 in FIG. 2 is a multi-cycle path of N cycles. Similarly to the above case, in the cycle 1, the first flip-flop 103 holds data input into the input terminal DI in synchronization with a rise of the clock signal CLK, and outputs the data FF1DO from the output terminal DO. In response to the operation, since the input data FF2DI of the second flip-flop 104 is permitted to vary to a new value at a timing of any one of cycles 1 to 4, in the cycles 1 to 4, the value is an undefined value (undefined value of zero or one). The second flip-flop 104 is required to perform correct circuit operation even if the input data FF2DI varies during any one of the cycles 1 to 4.

When the write-enable signal FF2WE is at the high level, the second flip-flop 104 holds the data FF2DI input into the input terminal DI in synchronization with a rise of the clock signal CLK, and outputs the data FF2DO from the output terminal DO. Accordingly, the output data FF2DO has an undefined value during cycles 2 to 4.

In the circuit, the output data FF1DO of the first flip-flop 103 in the cycle 1 reaches the input terminal DI of the second flip-flop 104 as the data FF2DI in any one of the cycles 1, 2, 3, to N. In order to use the circuit as a multi-cycle path, it is necessary to design the circuit such that even if the input data FF2DI of the second flip-flop 104 varies in any one of the cycles 1, 2, 3, to N, the circuit correctly operates.

Generally, the multi-cycle path is intentionally designed by a circuit designer. In the description below, it is assumed that paths of the multi-cycle path are described in timing constraint information (Design Constraints) or the like that is used as standard input information in circuit specifications, logic synthesis, layout, wiring, and static timing analysis that are development flows after logic verification.

In the description, the development of the semiconductor integrated circuit is implemented in accordance with steps of, as a first step, implementing design of a logic circuit at a register transfer level (hereinafter, referred to as RTL) (logic design), as a second step, verifying validity of the logic circuit (logic verification), as a third step, synthesizing the verified logic circuit to a gate level (logic synthesis), as a fourth step, laying out and wiring the synthesized circuit (layout and wiring), and as a fifth step, implementing timing verification (static timing analysis (STA)). Further, in the specification, gate level simulation that includes delay is described. It is assumed that the gate level simulation is implemented as a sixth step after the static timing analysis is completed.

Now, problems where the multi-cycle path is verified at RTL are described. When the circuit designer verifies operation of the multi-cycle path as a logic circuit, with respect to a signal defined as a multi-cycle path, and additionally verifies whether the signal can actually be used as the multi-cycle path it is necessary to verify the logic circuit operation in consideration of delay.

This is because, in the multi-cycle path, it is necessary to check whether the operation of the multi-cycle path is normal even if data delay in a period, when the output data FF1DO of the first flip-flop 103 reaches the input terminal DI of the second flip-flop 104 as the data FF2DI, is in any one of the cycles 1, 2, 3, to N.

Normally, the operation verification in the logical verification is implemented at RTL without delay. If the delay is not included, it is difficult to verify whether the multi-cycle path of N cycles operates normally even when the data delay is at any one of the cycles 1, 2, 3, to N. Hereinafter, the reason is described.

FIG. 4B is a timing chart where logical verification of a multi-cycle path is implemented at RTL. At RTL, gate delay and wiring delay between the flip-flop 103 and the flip-flop 104 is not considered. Accordingly, if the output data FF1DO of the first flip-flop 103 varies in the cycle 1, the input data FF2DI of the second flip-flop 104 also varies in the same cycle 1. In the next cycle 2, the output data FF2DO of the second flip-flop 104 is fixed to a new value.

If the timing chart in FIG. 4B is compared to the timing chart of the single cycle path in FIG. 3, it is understood that, in both cases, the operation of the second flip-flop 104 at the rise timing of the clock signal CLK is the same. This means that, in both cases, the operation is the same as verification of the single cycle path. Further, if the timing chart in FIG. 4B is compared to the operational view of the multi-cycle path of N cycles in FIG. 4A, it is understood that, in the operation of the second flip-flop 104, at the rise timing of the clock signal CLK, the values are different from values originally expected in the multi-cycle path in cycles 2 to 4. Accordingly, it is understood that it is not possible to correctly verify the multi-cycle path in the logical simulation at RTL.

As the method to perform verification of operation of a logic circuit in consideration of delay, two methods described below have been known.

In the first method, the verification is performed by gate level simulation that is performed after the circuit is laid out and wired. In the gate level simulation to be performed after the circuit is laid out and wired actual gate delay and wiring delay is contained. Accordingly, it is possible to consider data delay in the multi-cycle path.

The first method is excellent in verifying that the specific semiconductor integrated circuit correctly operates. However, the verification is performed in the state that the gate delay and the wiring delay have values unique to the semiconductor integrated circuit. Accordingly, in the verification, the operation (FIG. 4A) of the multi-cycle path of N cycles, where the data variation is in any one of the cycles 1, 2, 3, to N, the correct operation of the multi-cycle path is not verified.

Further, to perform the logical simulation with the gate delay and the wiring delay, it is necessary to perform the simulation after the logic synthesis, the layout, the wiring, the static timing analysis (STA), and the like. These are the development flows performed after the logic verification is performed. Accordingly, a large amount of additional man-hours are required for returning to the job when a malfunction is found in specifying the multi-cycle path. Especially, in the development of current semiconductor integrated circuits that are growing in scale, a loss of efficiency during the development period is very serious.

As the second method, in Japanese Patent Application Laid-Open Publication No. 2006-318121, a method to intentionally apply delay to a target part in RTL verification is described. In the RTL description, it is possible to add a delay value to a specific signal. The function can be used in many simulation apparatuses. Accordingly, it is possible to reproduce pseudo logical verification with consideration of delay.

However, in the second method, the delay value that can be applied in one logical simulation is a constant value. Accordingly, similar to the first method, in the second method, in order to verify that the multi-cycle path of N cycles operates correctly (FIG. 4A) when the data variation is at any one of the cycles 1, 2, 3, to N, it is necessary to perform logical simulation at least N times with respect to one multi-cycle path, and it is not efficient.

For example, in a case where a plurality of multi-cycle paths of N cycles exist in a circuit, and the paths are operationally associated with each other, it may be necessary to consider combinations of delay values to be applied to the individual multi-cycle paths. As a result, the number of combinations necessary for the verification becomes enormous.

Further, as a third method, in Japanese Patent Application Laid-Open Publication No. 2001-273351, a technique to analyze a circuit configuration at RTL or a gate level and provide a part that can be defined as a multi-cycle path has been described. The method is effective to exhaustively search for multi-cycle paths including a multi-cycle path unintentionally made by the circuit designer.

However, in the multi-cycle paths in the circuit, in addition to a multi-cycle path defined by the circuit configuration, many parts that can be defined as multi-cycle paths by reasons depending on the specification, or the other logical circuits exist. Accordingly, it is difficult to determine whether multi-cycle part information described in the circuit specification or the like is really correct using only this technique.

SUMMARY

According to aspects in accordance with an embodiment, a simulation apparatus is provided that performs simulation of design data of a verification target circuit including a logic circuit that operates as a multi-cycle path of N cycles in synchronization with a clock signal, the simulation apparatus includes a design data generation section that generates design data of a multi-cycle verification circuit for selectively providing an undefined value signal in place of a signal in a multi-cycle part in the verification target circuit, a logical simulation section that performs logical simulation without delay on the basis of design data of the verification target circuit and the design data of the multi-cycle verification circuit, and a comparison section that compares the signal of the verification target circuit with a signal of an expected value in the verification target circuit in the logical simulation.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 4A is a timing chart where the verification target circuit in FIG. 2 is a multi-cycle path of N cycles. FIG. 4B is a timing chart where a multi-cycle path is logical-verified at RTL.

DESCRIPTION OF THE PREFERRED EMBODIMENTS

First Embodiment

Figure 13:
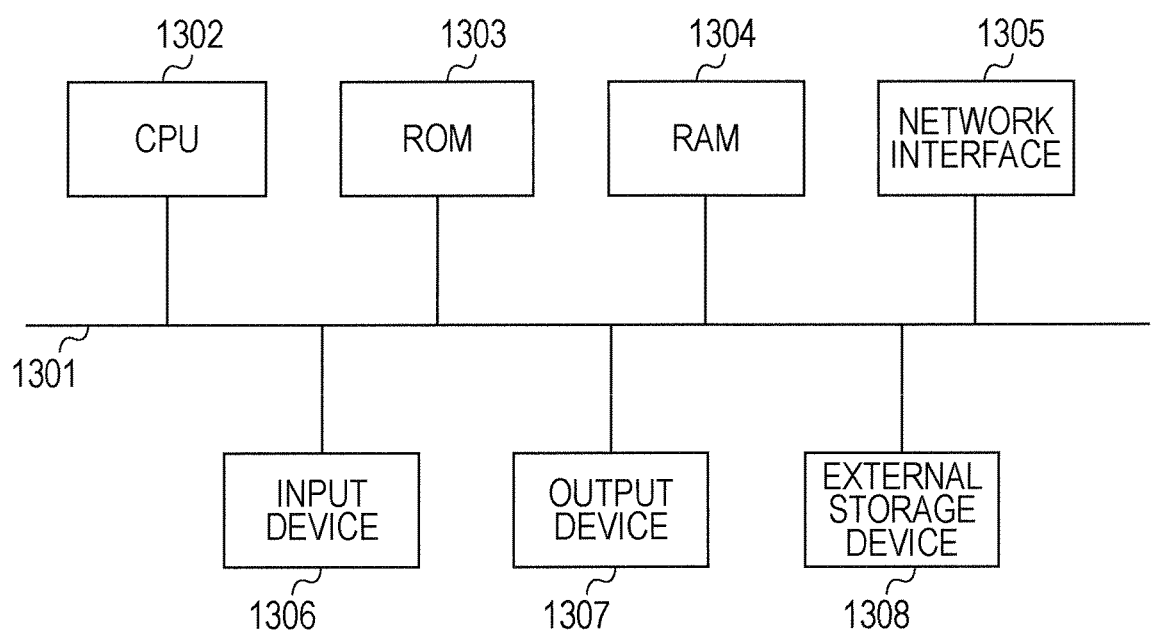
FIG. 13 is a block diagram illustrating an example of a configuration of a computer included in the simulation apparatus according to aspects of the first embodiment.

FIG. 13 is a block diagram illustrating an example of a configuration of a computer included in the simulation apparatus according to aspects in accordance with a first embodiment. The computer can generate RTL design data and net list design data by computer-aided design (CAD), and perform simulation.

To a bus 1301, a central processing unit (CPU) 1302, a read-only memory (ROM) 1303, a random access memory (RAM) 1304, a network interface 1305, an input device 1306, an output device 1307, and an external storage device 1308 are connected.

The CPU 1302 performs processing of data and calculation, and controls the above-described configuration unit that is connected via the bus 1301. In the ROM 1303, a boot program is stored in advance. By implementing the boot program by the CPU 1302, the computer is started up. In the external storage device 1308, a computer program is stored. The computer program is copied into the RAM 1304, and the program is implemented by the CPU 1302. The computer can perform simulation and multi-cycle verification described below by implementing the computer program.

The external storage unit 1308 is, for example, a hard disk storage device. Even if power source of the device 1308 is turned off, the memory content is not lost. The external storage unit 1308 can record a computer program, RTL design data, and the like in a recording medium, and read the computer program or the like from the recording medium.

The network interface 1305 can input or output a computer program, RTL design data, or the like to a network. The input device 1306 is, for example, a keyboard or a pointing device (mouse). Using the input device 1306, it is possible to perform various specifying operations or inputting operations. The output device 1307 is a display, a printer, or the like. The output device 1307 can display or print.

The embodiment can be realized by implementing the program by the computer. Further, means for providing the program to the computer, for example, a computer-readable recording medium such as a compact disc read only memory (CD-ROM) that records the program and a transmission medium such as the Internet that transmits the program can be applied as embodiments. Further, a computer program product such as the computer-readable recording medium that records the program can be applied as an embodiment. The program, the recording medium, the transmission medium, and the computer program product can be included in the scope of the present invention. As the recording medium, for example, a flexible disk, a hard disk, an optical disk, a magneto-optical disk, a CD-ROM, a magnetic tape, a nonvolatile memory card, a ROM, and the like can be used.

Figure 1:
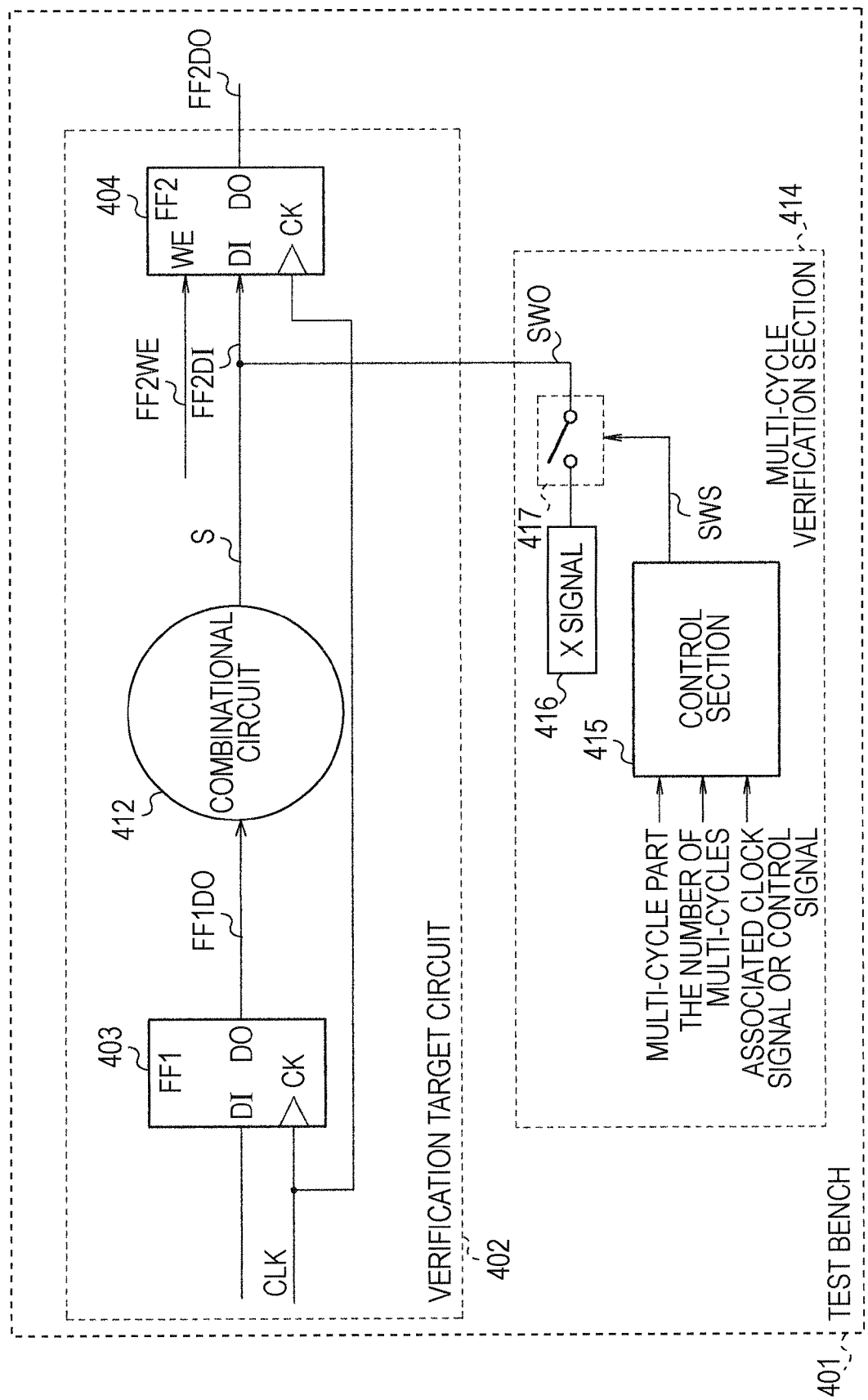
FIG. 1 is a schematic view illustrating a test bench of a simulation apparatus according to aspects in accordance with a first embodiment.
Figure 2:
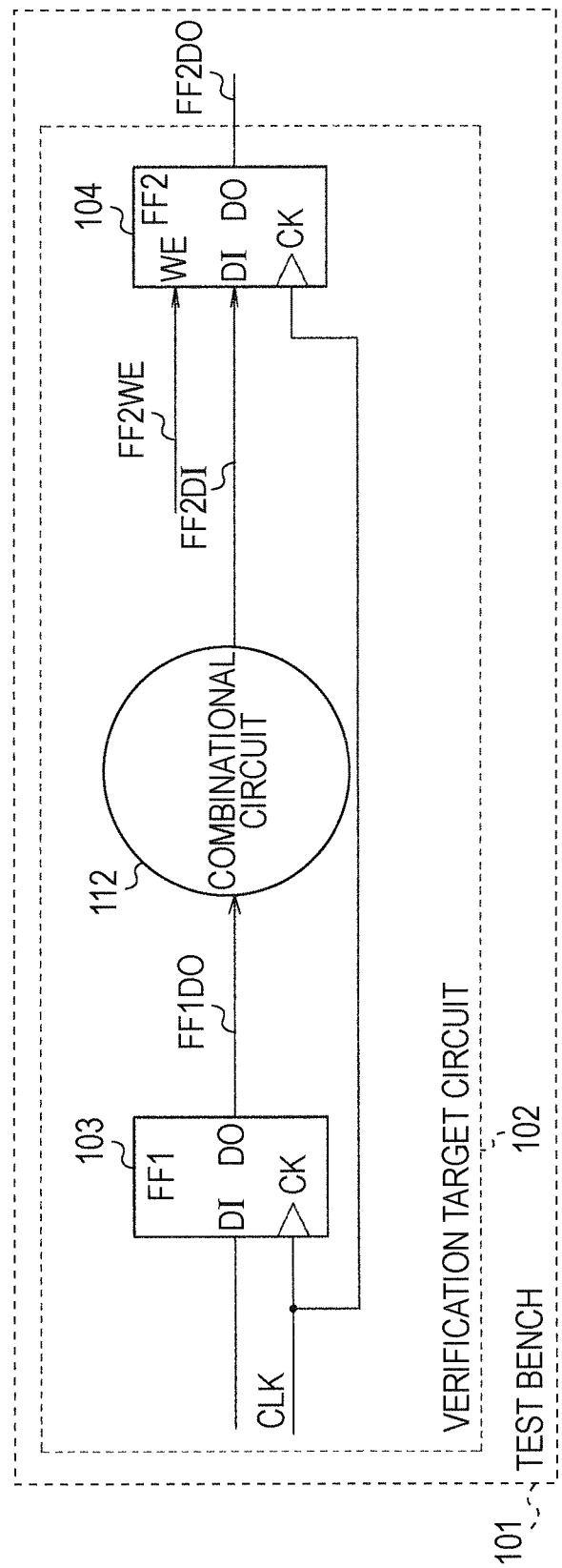
FIG. 2 is a view illustrating a test bench for simulating a clock synchronization logic circuit that includes two flip-flops and a combinational circuit connected between the flip-flops.
Figure 3:
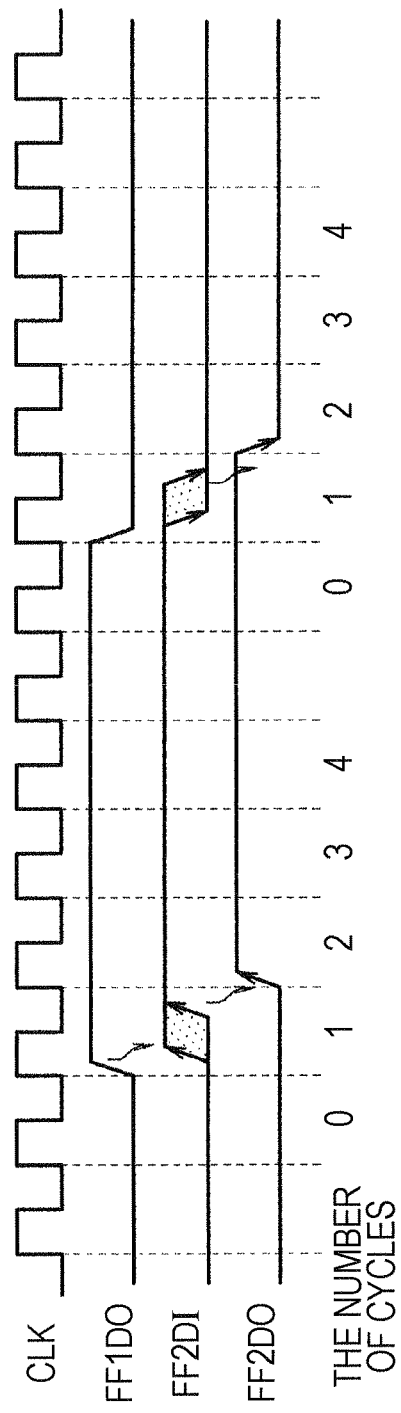
FIG. 3 is a timing chart illustrating an exemplary operation of a verification target circuit.

FIG. 1 is a schematic view illustrating a test bench of a simulation apparatus according to aspects of the embodiment. A test bench 401 is a system that includes a verification target circuit 402 and a test description. The test bench 401 is software (program) for performing simulation. The test bench 401 includes the verification target circuit 402 and a multi-cycle verification section 414. The verification target circuit 402 and the multi-cycle verification section 414 are circuit data described in RTL design data. In a simulation apparatus in FIG. 13, the test bench 401 is installed. By implementing the test bench 401, simulation is performed.

The verification target circuit 402 is, for example, a clock synchronization logic circuit that includes two flip-flops 403 and 404 and a combinational circuit 412 connected between the flip-flops. The combinational circuit 412 is connected between an output terminal DO of the first flip-flop 403 and an input terminal DI of the second flip-flop 404. The multi-cycle verification section 414 includes a control section 415, an X signal output section 416, and a switch 417. The switch 417, in response to an output signal SWS of the control section 415, outputs an output signal of the X signal output section 416 to the input terminal DI of the second flip-flop 404. The X signal output section 416 outputs an X signal (undefined value signal). The X signal shows an undefined value that is not defined as zero or one.

It is assumed that a circuit from the output terminal DO of the first flip-flop 403 to the input terminal DI of the second flip-flop 404 is defined by the circuit designer that the circuit can be considered as a multi-cycle path of N cycles.

In the embodiment, in addition to the verification target circuit 402, the multi-cycle verification section 414 is added. The multi-cycle verification section 414, in an M cycle satisfying $1 \leq M < N$, forcibly substitutes the X value output by the X signal output section 416 in place of an output signal S of the combinational circuit 412.

The control section 415 outputs a control signal SWS depending on multi-cycle part information about a signal to be a multi-cycle target, the number of multi-cycles that permit maximum delay, and a clock to be a reference or a control signal. The switch 417, in response to the control signal SWS, outputs the X signal as a signal SWO in a cycle where the output signal S of the combinational circuit 412 has an undefined value.

Figure 5:
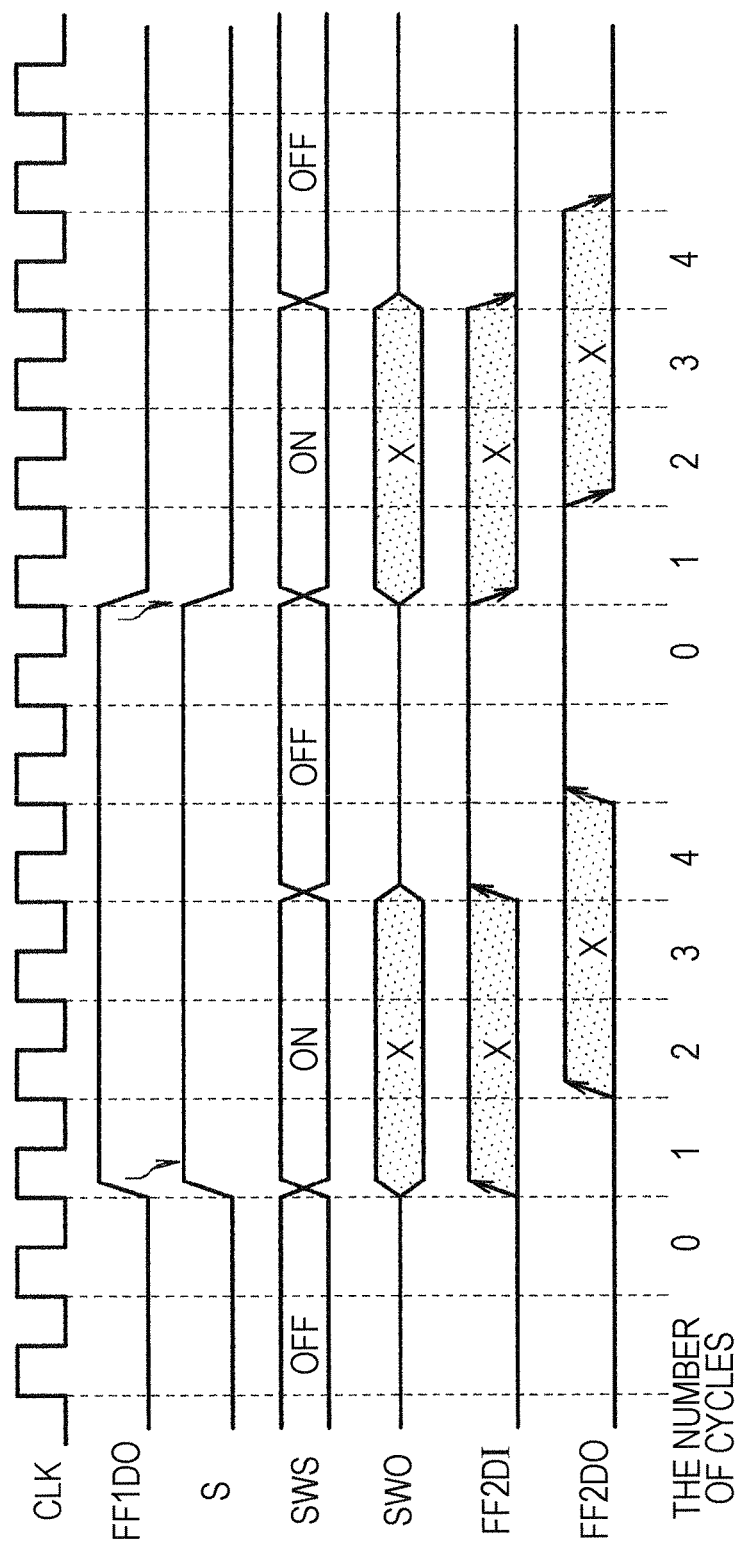
FIG. 5 is a timing chart illustrating an exemplary operation of the simulation apparatus according to the aspects of the first embodiment.

FIG. 5 is a timing chart illustrating an exemplary operation of the simulation apparatus according to aspects of the first embodiment. The simulation apparatus performs simulation at RTL. The number of cycles shows the number of cycles of a clock signal CLK. Hereinafter, operation of a multi-cycle path of N cycles is described. N is, for example, four.

In a cycle 1, the first flip-flop 403 holds data input into the input terminal DI in synchronization with rising of the clock signal CLK, and outputs data FF1DO from the output terminal DO. Since RTL does not include delay, the combinational circuit 412 inputs the signal FF1DO and outputs a signal S without delay. In the multi-cycle path of N (for example, four) cycles, input data FF2DI of the second flip-flop 404 is permitted to vary to a new value in any one of the cycles 1 to 4. Accordingly, the control section 415, on the basis of multi-cycle part information (for example, the signal S), the number of multi-cycles (for example, four), and the clock signal CLK associated with the multi-cycle path, outputs an ON control signal SWS in the cycles 1 to 3, and outputs an OFF control signal SWS in the other cycles.

When the control signal SWS is on, the switch 417 is turned on. Then, an output signal SWO of the switch 417 becomes the X signal output from the X signal output section 416, and the input signal FF2DI of the second flip-flop 404 also becomes the X signal output from the X signal output section 416. When the control signal SWS is off, the switch 417 is turned off. Then, the output signal SWO of the switch 417 becomes a high impedance state, and the input signal FF2DI of the second flip-flop 404 becomes the same signal as the output signal S of the combinational circuit 412.

When a write-enable signal FF2WE is at a high level, the second flip-flop 404 holds the data FF2DI input into the input terminal DI in synchronization with a rise of the clock signal CLK, and outputs data FF2DO from the output terminal DO. Accordingly, the output data FF2DO has an undefined value X in the cycles 2 to 4.

In the M cycle satisfying $1 \leq M < N$, that is, in cycles 1 to N−1, the switch 417 is turned on. Accordingly, the input signal FF2DI of the second flip-flop 404 has an undefined value X. After the operation, the switch 417 is turned off, and the input signal FF2DI of the second flip-flop 404 has the same signal as the signal S in the cycle N.

Now, the timing chart in FIG. 5 is compared with the timing chart of the multi-cycle path of N cycles in FIG. 4A. In FIG. 4A, the input signal FF2DI of the second flip-flop 104 varies at any one of the cycles 1 to N. This means that in the cycles 1 to N−1, the value is an undefined value X. The input signal FF2DI of the second flip-flop 104 is fixed to a new value in the cycle N.

On the other hand, if the timing charts in FIGS. 4A and 5 are compared with each other, operation of the second flip-flops 104 and 404 at the rising timing of the clock signals CLK corresponds to each other. That is, the timing chart obtained by the simulation apparatus according to aspects of the embodiment is the same operation as that expected in the multi-cycle path of N cycles.

Accordingly, the simulation apparatus according to aspects of the embodiment can easily reproduce the operation of the multi-cycle path of N cycles at RTL that is the early stage in the circuit design. Further, it is possible to verify the multi-cycle path of N cycles by one simulation without the problems described above, where "the data delay is fixed to a constant value" and "it is necessary to perform simulation a plurality of times".

Figure 6:
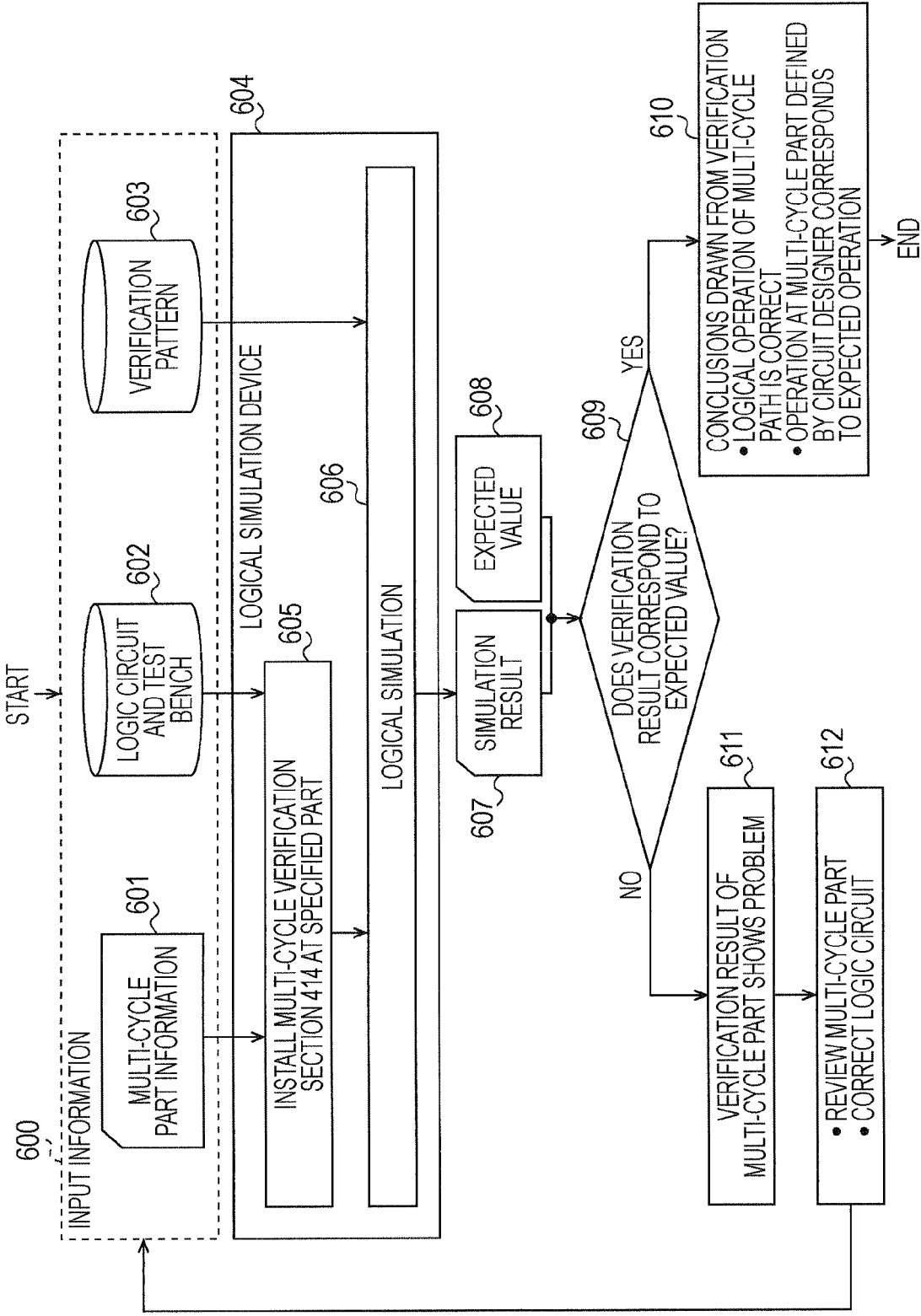
FIG. 6 is a flow chart illustrating a simulation method of the simulation apparatus according to aspects of the first embodiment.

FIG. 6 is a flow chart illustrating an exemplary operation of the simulation apparatus according to aspects of the first embodiment. In the embodiment, operation of the multi-cycle path of N cycles can be verified.

To the simulation apparatus, multi-cycle part information 601 is input as input information 600, in addition to a test bench 602 including a verification target circuit (logic circuit) that is necessary for the logical verification, and a verification pattern (test pattern) 603. All of the input information 600 is read into the simulation apparatus, and simulation is implemented.

The multi-cycle part information 601 can be used as a multi cycle defined by the circuit designer. It is assumed that the multi-cycle part information 601 includes a signal name in the multi-cycle part, a flip-flop name, the number of multi cycles, and information about other signals in an associated logic circuit. The test bench 602 corresponds to the test bench 401 in FIG. 1. The verification pattern 603 is input test data of the verification target circuit 402.

A logical simulation device 604 is formed by software processing in steps 605 and 606. In step S605, as illustrated in FIG. 1, on the basis of the multi-cycle part information 601 and the test bench 602, the simulation apparatus generates design data of the multi-cycle verification section 414, and installs the multi-cycle verification section 414 at a specified part. Then, in step S606, as illustrated in FIG. 5, the simulation apparatus performs logical simulation without delay on the basis of the test bench (including the multi-cycle verification section 414) 602 and the verification pattern 603, and outputs a simulation result 607. The simulation result 607 is an output signal of the verification target circuit 402 generated in the logical simulation.

The logical simulation in the simulation apparatus is different from a normal logical simulation in performing the logical simulation step 606 after reading the multi-cycle part information 601 and installing the circuit of the multi-cycle verification section 414 in FIG. 4.

An expected value 608 is a signal of an expected value generated as a result of the simulation of the verification target circuit 402 when the operation of the verification target circuit 402 is correct. In step S609, the simulation apparatus compares the simulation result 607 with the expected value 608 that is provided in advance.

If the simulation result 607 differs from the expected value 608, the processing proceeds to step S611. In step S611, the simulation apparatus determines there is a problem in the verification result of the multi-cycle part. This means that the multi-cycle part does not operate as expected. The reason of the malfunction may be that the multi-cycle part information 601 is not correct, that the verification target circuit (logic circuit) 402 is not configured to correspond to the multi-cycle path, or the like.

In step S612, the simulation apparatus reviews the test bench 602, the verification pattern 603, and the multi-cycle part information 601 that are the input information 600, and corrects the verification target circuit (logic circuit) 402. After the correction, the above processing is repeated until the simulation result 607 corresponds to the expected value 608.

If the simulation result 607 corresponds to the expected value 608, the processing proceeds to step S610. In step S610, the simulation apparatus can determine as described below. That is, first, it is possible to verify that the logical operation, considering the delay in the multi-cycle part, is correct. Secondly, it can be understood that the contents of the multi-cycle part information 601 used as the input information 600 are correct.

In the development of the semiconductor integrated circuit, as the first step, design of the logic circuit at RTL is implemented (logic design), as the second step, the validity of the logic circuit in FIG. 6 is verified (logic verification), as the third step, the verified logic circuit is synthesized to the gate level (logic synthesis), as the fourth step, the synthesized circuit is actually laid out and wired (layout and wiring), and as the fifth step, the timing verification is implemented (static timing analysis (STA)). Further, as the sixth step, the gate level simulation with delay is implemented.

As described above, according to the embodiment, the multi-cycle path can be verified at the early stage (RTL stage) of the design. Previously, in order to check whether the operation of the multi-cycle path is correct or not, it was necessary to perform the gate level simulation with wiring delay and gate delay, the simulation is the development step to be implemented after the logical verification. However, by using the simulation apparatus according to aspects of the embodiment, it is possible to check the operation at RTL at an early stage of the circuit design.

Further, in aspects of the embodiment, the multi-cycle path can be exhaustively verified. Further, in aspects of the embodiment, it is possible to verify the operation equivalent to the operation of the multi-cycle path of N cycles by the one simulation in the RTL verification without the previous problems in the multi-cycle path verification that "the data delay is fixed to a constant value" and "it is necessary to perform simulation a plurality of times".

Further, in aspects of the embodiment, it is possible to check the validity of the multi-cycle path intentionally designed by the designer. Using the simulation apparatus according to aspects of the embodiment, in the multi-cycle path defined by the circuit designer, it is possible to check whether the part defined as the multi-cycle path by the circuit designer can really be used as the multi-cycle path.

Second Embodiment

Figure 7:
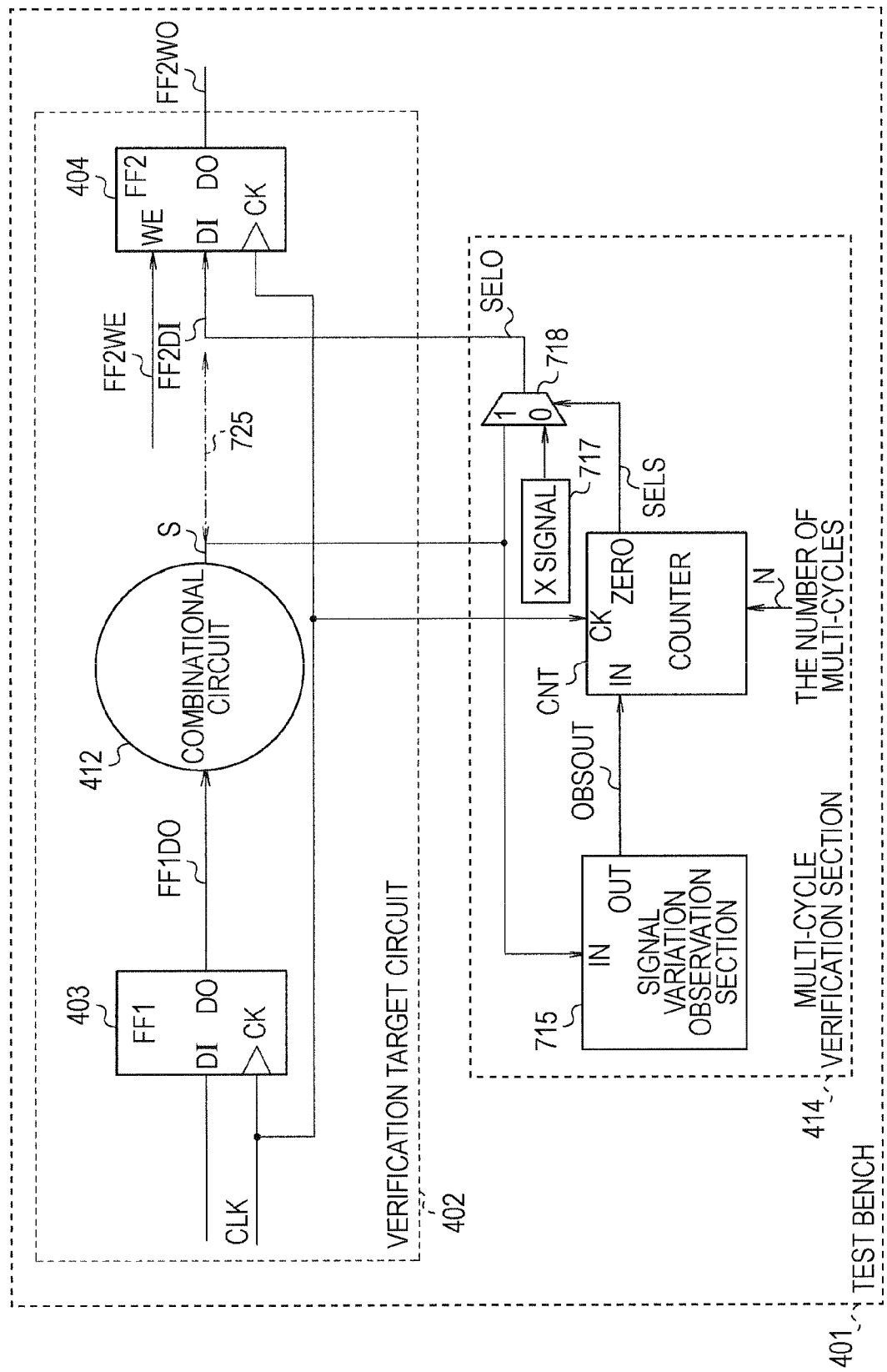
FIG. 7 is a schematic view illustrating a test bench of a simulation apparatus according to aspects in accordance with a second embodiment.

FIG. 7 is a schematic view illustrating a test bench of a simulation apparatus according to aspects of a second embodiment. In the second embodiment (FIG. 7), aspects are similar to the first embodiment (FIG. 1). Hereinafter, only the differences for the second embodiment are described.

In aspects of the second embodiment, when the test bench 401 is installed in the simulation apparatus, the signal S and the signal FF2DI are disconnected. The signal S is transmitted to the signal FF2DI via the multi-cycle verification section 414. After simulation is completed, the multi-cycle verification section 414 is deleted, and the signal S is directly connected to the signal FF2DI by a signal line 725.

The multi-cycle verification section 414 includes a signal variation observation section 715 that observes variation of the signal S, a counter CNT that calculates the number of cycles to drive an X signal on the basis of the number of multi-cycles N, an X signal output section 717 that outputs an X signal, and a selector 718 that selectively provides the X signal or the signal S to the input terminal DI of the second flip-flop 404.

Figure 8:
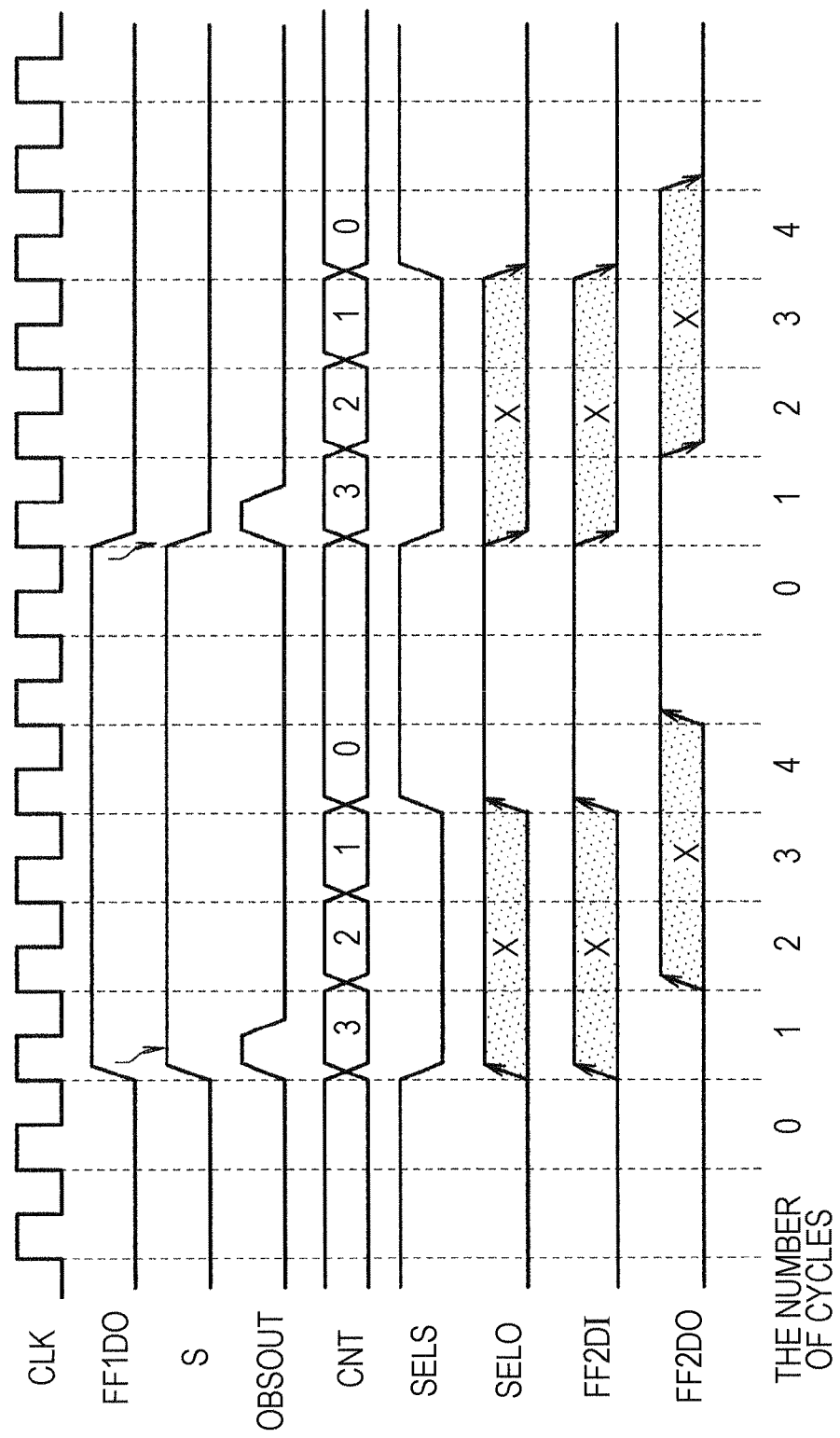
FIG. 8 is a timing chart illustrating an exemplary operation of the simulation apparatus according to aspects of the second embodiment.

FIG. 8 is a timing chart illustrating an exemplary operation of the simulation apparatus according to aspects of the second embodiment. In a cycle 1, the output signal FF1DO of the first flip-flop 403 varies, and the variation reaches the signal S. Then, the signal variation observation section 715 in the multi-cycle verification section 414 detects the variation of the multi-cycle signal S, and outputs a detection signal OBSOUT as a pulse signal to the counter CNT. Here, the signal S that is a target to be verified is information given as a verification pattern by the circuit designer.

Then, in the cycle 1, in response to input of the pulse of the detection signal OBSOUT, the counter CNT sets the number of multi-cycle N−1 (for example, three), starts down count in synchronization with the clock signal CLK, and sets a control signal SELS to a low level. In a cycle 4, when the count value becomes zero, the counter CNT sets the control signal SELS to a high level. Here, the multi-cycle signal S and the number of multi-cycles N are information set by the circuit designer.

The selector 718 selects the signal S when the control signal SELS is at the high level, selects the X signal when the control signal SELS is at the low level, and outputs the selected signal as a signal SELO to the input terminal DI of the second flip-flop 404. As a result, the input signal FF2DI of the second flip-flop 404 has an undefined value X in the cycles 1 to 3, and becomes the same signal as the signal S in the cycle 4.

Now, the timing chart in FIG. 8 is compared with the timing chart of the multi-cycle path of N cycles in FIG. 4A. In FIG. 4A, the input signal FF2DI of the second flip-flop 104 varies at timing any one of the cycles 1 to N. This means that in the cycles 1 to N−1, the value has an undefined value X. The input signal FF2DI of the second flip-flop 104 is fixed to a new value in the cycle N.

On the other hand, if the timing charts in FIGS. 8 and 4A are compared with each other, operation of the second flip-flops 104 and 404 at the rising timing of the clock signals CLK corresponds to each other. That is, the timing chart obtained by the simulation apparatus according to aspects of the embodiment is the same operation as that expected in the multi-cycle path of N cycles.

Figure 9:
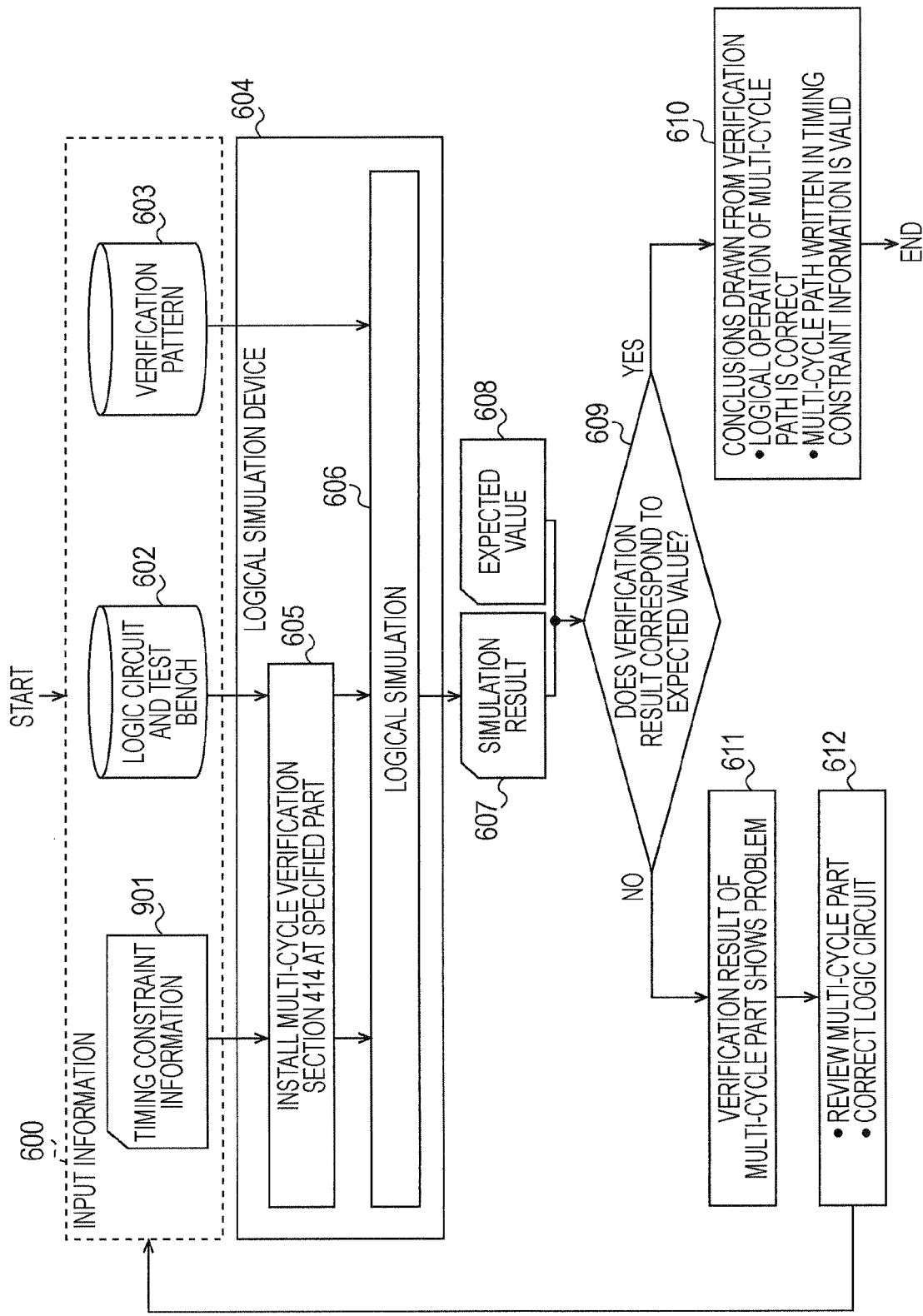
FIG. 9 is a flow chart illustrating a simulation method of the simulation apparatus according to aspects of the second embodiment.

FIG. 9 is a flow chart illustrating a simulation method in the simulation apparatus according to aspects of the second embodiment. The second embodiment (FIG. 9) differs from the first embodiment (FIG. 6) in that timing constraint information 901 is used in place of the multi-cycle part information 601. The test bench 602 corresponds to the test bench 401 in FIG. 7.

The timing constraint information 901 is defined by the circuit designer, and generated by formatting information including a list of a multi-cycle part exiting in the verification target circuit 402, for example, an Synopsys Design Constraint (SDC) file. The timing constraint information 901 is normally used in logic synthesis, layout and wiring, and STA that are development flows implemented after logical verification. Normally, the information about a multi-cycle path includes, in addition to a signal name to be a multi-cycle target, and information about an associated flip-flop name, clock information associated with the number of multi cycles. Accordingly, the timing constraint information 901 is the optimum information to be used as the multi-cycle part information.

In step S605, as illustrated in FIG. 7, on the basis of the timing constraint information (including multi-cycle part information) 901 and the test bench 602, the simulation apparatus generates design data of the multi-cycle verification section 414, and installs the multi-cycle verification section 414 at a specified part. Then, in step S606, as illustrated in FIG. 8, the simulation apparatus performs simulation without delay on the basis of the test bench (including the multi-cycle verification section 414) 602 and the verification pattern 603, and outputs the simulation result 607.

In step S609, the simulation apparatus compares the simulation result 607 with the expected value 608. When the simulation result 607 differs from the expected value 608, it means that the operation in the multi-cycle part is not the expected operation. Then, the processing proceeds to step S611 As the reason of the malfunction of the multi-cycle path, it can be considered that the timing constraint information 901 is not correct, the circuit is not configured to correspond to the multi-cycle path, or the like. In such a case, in step S612, the simulation apparatus reviews the test bench 602, the verification pattern 603, and the timing constraint information 901 that are the input information 600, and corrects the verification target circuit (logic circuit) 402. After the correction, the processing in FIG. 9 is repeated until the simulation result 607 corresponds to the expected value 608.

When the simulation result 607 corresponds to the expected value 608, the processing proceeds to step S610. Then, the simulation apparatus can operate as described below. That is, first, it is possible to verify that the logical operation considering the delay in the multi-cycle part is correct. Secondly, it can be understood that the contents of the timing constraint information 901 used as the input information 600 are correct.

Especially, when the simulation apparatus according to aspects of the second embodiment is used, it is important that the verification of the timing constraint information 901 can be performed. Since the timing constraint information 901 is used as standard input information in the logic synthesis, the layout and the wiring, and the STA that are development flows implemented after the logical verification, by designing the circuit on the basis of the information, it is possible to ensure the operation of the circuit in the gate level simulation with delay after the layout and wiring.

Third Embodiment

Figure 10:
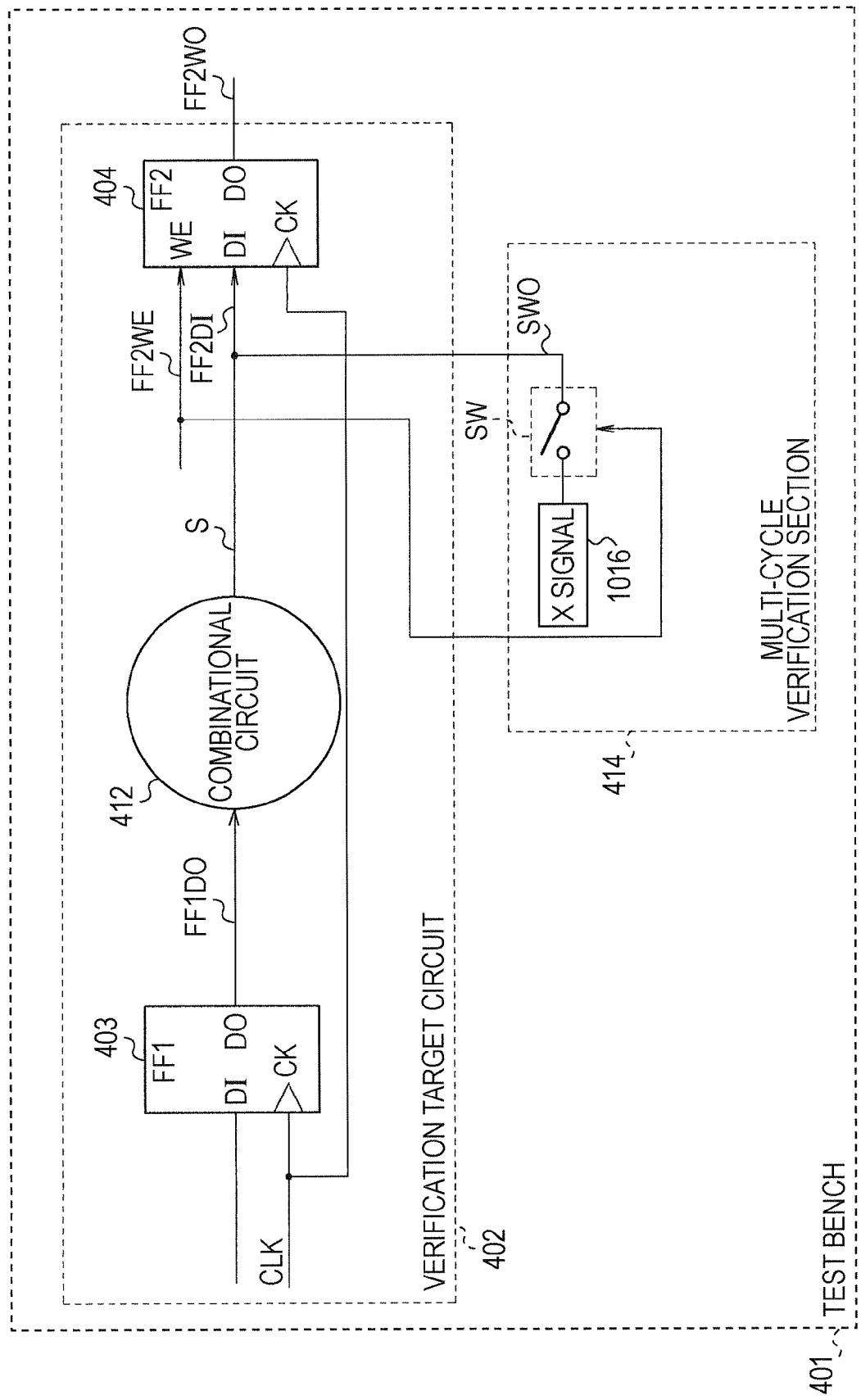
FIG. 10 is a schematic view illustrating a test bench of a simulation apparatus according to aspects in accordance with a third embodiment.

FIG. 10 is a schematic view illustrating a test bench of a simulation apparatus according to aspects of a third embodiment. In the third embodiment (FIG. 10), similar to the first embodiment (FIG. 1), a specific example of the multi-cycle verification section 414 is described. Hereinafter, only the different points of the third embodiment are described.

The multi-cycle verification section 414 includes an X signal output section 1016, an a switch SW. The X signal output section 1016 outputs an X signal. A write enable signal FF2WE is a control signal that shows valid or invalid of writing of an input signal FF2DI into the second flip-flop 404. The switch SW, depending on the write enable signal FF2WE, connects or disconnects a terminal of an output signal of the X signal output section 1016 and a terminal of the signal FF2DI.

The use of the write enable signal FF2WE as the control signal of the switch SW is one of the simplest simulation methods for enabling the signal S to be used as a multi-cycle path. Because, by varying the write enable signal FF2WE depending on the number of multi cycles, in a cycle that has an undefined value, writing of data into the second flip-flop 404 can be inhibited.

Figure 11:
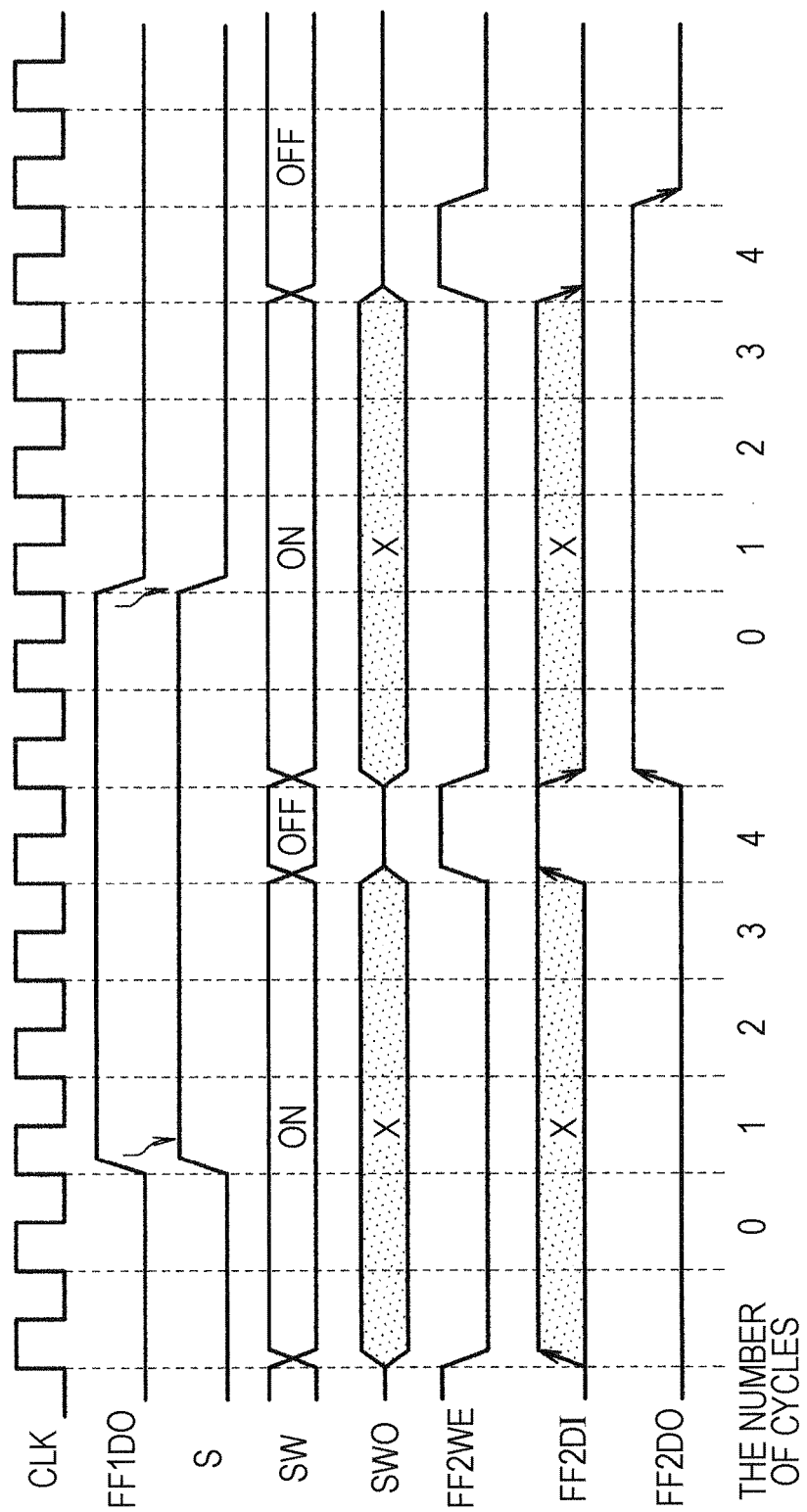
FIG. 11 is a timing chart illustrating an exemplary operation of the simulation apparatus according to aspects of the third embodiment.

FIG. 11 is a timing chart illustrating an example of operation of the simulation apparatus according to aspects of the third embodiment. The write enable signal FF2WE is set to a low level at a cycle the signal S has an undefined value X.

In the cycle 1, the output signal FF1DO of the first flip-flop 403 varies, and the variation reaches the signal S. However, in the cycle 1, the write enable signal FF2WE is at the low level. Accordingly, the switch SW is turned on, and the switch SW outputs the X signal as a signal SWO to the input terminal DI of the second flip-flop 404. As a result, the input signal FF2DI of the second flip-flop 404 has an undefined value X similarly to the signal SWO. The second flip-flop 404, when the write enable signal FF2WE is at the low level, does not perform the writing of data, and outputs data held in the second flip-flop 404 as a signal FF2DO. That is, the signal FF2DO is the same data as the previous data, and the data is not changed.

In a cycle N (for example, four), when the write enable signal FF2WE is at the high level, the switch SW is turned off. Then, the output signal SWO of the switch SW becomes a high impedance state. As a result, the input signal FF2DI of the second flip-flop 404 becomes the same signal as the signal S. The second flip-flop 404, when the write enable signal FF2WE is at the high level, writes and holds the input signal FF2DI, and outputs the held data as the signal FF2DO.

To a write enable terminal WE of the second flip-flop 404, if a correct write enable signal FF2WE is connected, the output signal FF2WO of the second flip-flop 404 becomes a correct signal not depending on the X signal. However, to the write enable terminal WE of the second flip-flop 404, if an incorrect write enable signal FF2WE is connected, the X signal is transmitted to the output signal FF2WO of the second flip-flop 404, and a malfunction occurs in the operation of the verification target circuit 402.

Now, the timing chart in FIG. 11 is compared with the timing chart of the multi-cycle path of N cycles in FIG. 4A. In FIG. 4A, the input signal FF2DI of the second flip-flop 104 varies at timing any one of the cycles 1 to N. This means that in the cycles 1 to N−1, the input signal FF2DI has an undefined value X. The input signal FF2DI is fixed to a new value in the cycle N.

On the other hand, if the timing charts in FIGS. 11 and 4A are compared with each other, operation of the second flip-flops 104 and 404 at the rising timing of the clock signals CLK corresponds to each other. That is, the timing chart obtained by the simulation apparatus according to aspects of the embodiment is the same operation as that expected in the multi-cycle path of N cycles.

Figure 12:
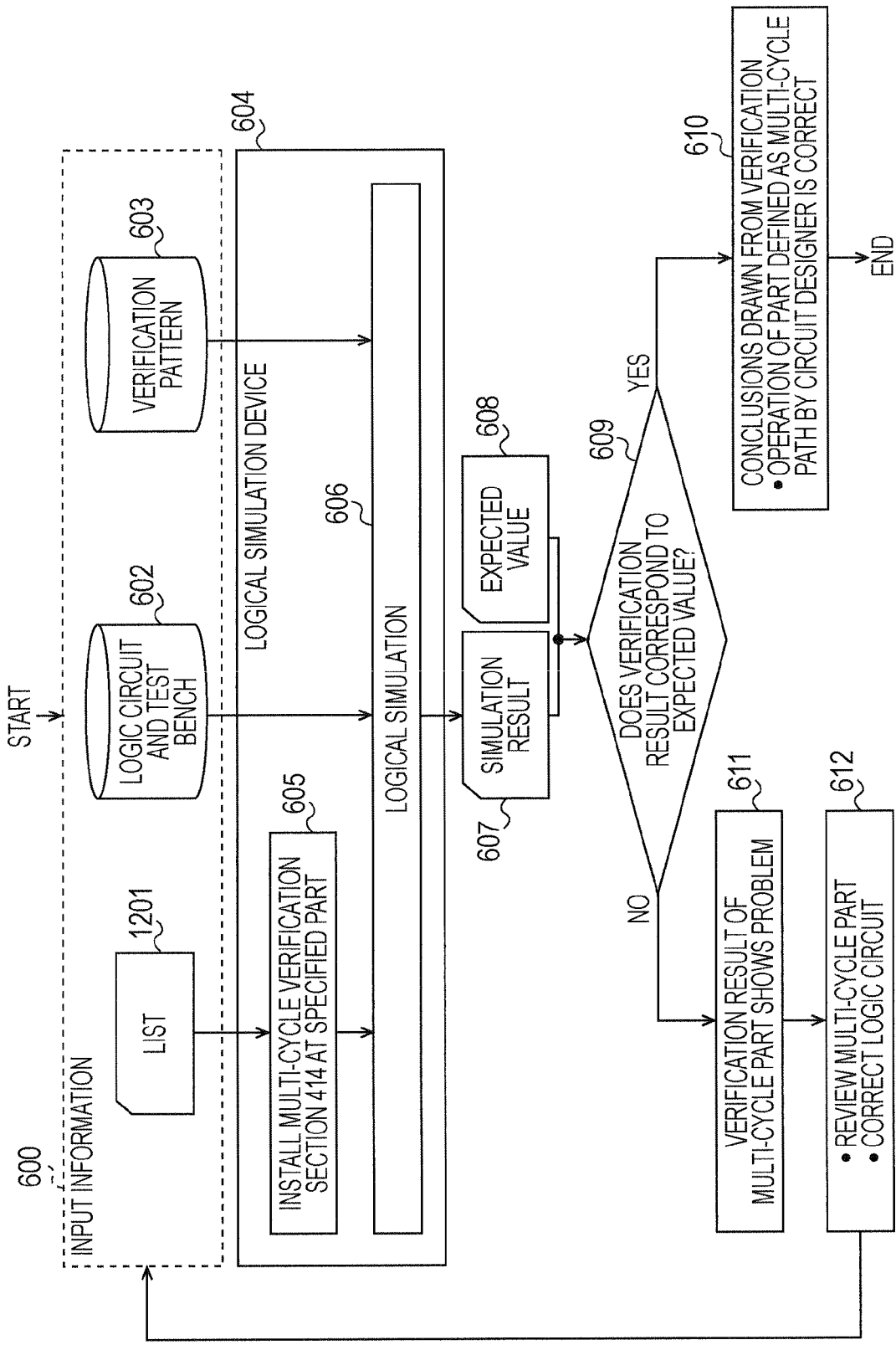
FIG. 12 is a flow chart illustrating a simulation method of the simulation apparatus according to aspects of the third embodiment.

FIG. 12 is a flow chart illustrating a simulation method in the simulation apparatus according to aspects of the third embodiment. The third embodiment (FIG. 12) differs from the first embodiment (FIG. 6) in that a list 1201 is used in place of the multi-cycle part information 601. The test bench 602 corresponds to the test bench 401 in FIG. 10. Hereinafter, the points of the third embodiment that are different from those in the first embodiment are described.

The list 1201 includes a multi-cycle signal name (for example, signal S) and a signal (for example, write enable signal FF2WE) that shows valid or invalid for the signal. The list 1201 is set by the designer.

In step S605, as illustrated in FIG. 10, on the basis of the list 1201 and the test bench 602, the simulation apparatus generates design data of the multi-cycle verification section 414, and installs the multi-cycle verification section 414 at a specified part. Then, in step S606, as illustrated in FIG. 11, the simulation apparatus performs logical simulation without delay on the basis of the test bench (including the multi-cycle verification section 414) 602 and the verification pattern 603, and outputs the simulation result 607.

In step S609, the simulation apparatus compares the simulation result 607 with the expected value 608. When the simulation result 607 differs from the expected value 608, it means that the operation at the multi-cycle part is not the expected operation. Then, the processing proceeds to step S611. The reason of the malfunction in the multi-cycle path can be considered to be that the operation cycle of the write enable signal FF2WE is not the expected operation, or the like. In such a case, in step S612, the simulation apparatus reviews the list 1201, the test bench 602, and the verification pattern 603 that are the input information 600, and corrects the verification target circuit (logic circuit) 402. After the correction, the processing in FIG. 12 is repeated until the simulation result 1207 corresponds to the expected value 608.

By the simulation apparatus according to aspects of the third embodiment, the input signal FF2DI of the second flip-flop 404 is fixed to a value only in the period the write enable signal FF2WE shows the high level. When the connection between the write enable terminal WE of the second flip-flop 404 and the write enable signal FF2WE or the operation of the write enable signal FF2WE is wrong, an undefined value X is input into the second flip-flop 404, and the signal FF2DO has the undefined value X. Accordingly, the simulation result 607 differs from the expected value 608. Thus, it is possible to find the malfunction of the verification target circuit 402.

When the simulation result 607 corresponds to the expected value 608, the processing proceeds to step S610. Then, the simulation apparatus can determine as described below. That is, first, it is possible to verify that the logical operation considering the delay in the multi-cycle part is correct. Secondly, the list 1201 used as the input information 600 is correct.

As described above, according to aspects of the first to third embodiments, the multi-cycle path can be verified at an early stage (RTL stage) of the design. Previously, in order to check whether the operation of the multi-cycle path is correct or not, it was necessary to perform the gate level simulation with wiring delay and gate delay, the simulation is the development step to be implemented after the logical verification. However, by using the simulation apparatus according to aspects of the embodiments, it is possible to check the operation at RTL at an early stage of the circuit design.

Further, in aspects of the embodiments, the multi-cycle path can be exhaustively verified. Further, in aspects of the embodiments, it is possible to verify the operation equivalent to the operation of the multi-cycle path of N cycles by the one simulation in the RTL verification without the problems in the multi-cycle path verification that "the data delay is fixed to a constant value" and "it is necessary to perform simulation a plurality of times".

Further, in aspects of the embodiments, it is possible to check the validity of the multi-cycle path intentionally designed by the designer. Using the simulation apparatus according to aspects of the embodiments, in the multi-cycle path defined by the circuit designer, it is possible to check whether the part defined as the multi-cycle path by the circuit designer can really be used as the multi-cycle path.

Especially, in the case of aspects of the second embodiment, not only ensuring the operation as the verification target circuit 402, but the validity of the timing constraint information 901 can be checked, and it is very effective.

Further, using the timing constraint information 901 verified in aspects of the second embodiment as standard input information in the layout, the wiring, and the STA that are to be implemented after the logic verification, the operation in the gate level simulation implemented after the layout and the wiring can be ensured at an early stage of the design. The feature reduces man-hours by preventing the need to return to the designing phase when a malfunction is found in the timing constraint information 901, thereby drastically increasing the design efficiency.

The simulation apparatus according to aspects of the first to third embodiments performs simulation of design data of the verification target circuit 402 including the logic circuit that operates as the multi-cycle path of N cycles in synchronization with a clock signal. The simulation apparatus includes the design data generation means (step S605 in FIG. 6, etc.) that generates design data of the multi-cycle verification circuit (multi-cycle verification section) 414 for selectively providing an undefined value signal (X signal) in place of a signal in a multi-cycle part in the verification target circuit 402, the logical simulation means (step S606 in FIG. 6, etc.) that performs logical simulation without delay on the basis of the design data of the verification target circuit 402 and the design data of the multi-cycle verification circuit 414, and the comparison means (step S609 in FIG. 6, etc.) that compares the signal 607 of the verification target circuit with the signal 608 of the expected value in the verification target circuit in the logical simulation.

In FIG. 7, the multi-cycle verification circuit 414 includes the signal variation detection circuit (signal variation observation section) 715 that detects variation of the signal in the multi-cycle part in the verification target circuit 402. After variation of the signal is detected, during an M cycle that satisfies 1≦M<N, the multi-cycle verification circuit 414 provides an undefined value signal in place of the signal in the multi-cycle part in the verification target circuit 402.

Further, in FIG. 7, the multi-cycle verification circuit 414 includes the counter CNT that starts counting in response to the detection of variation of the signal by the signal variation observation circuit 715.

Further, in FIG. 7, the multi-cycle verification circuit 414 includes the selector 718 that selects the undefined value signal in the M cycle depending on the count value of the counter CNT, selects the signal in the multi-cycle part in the other cycles, and outputs the selected signal to an output destination (for example, the input terminal DI of the second flip-flop 404) of the signal in the multi-cycle part.

In step S605 in FIG. 9, the design data generation means generates design data of the multi-cycle verification circuit on the basis of multi-cycle part information in the SDC file (timing constraint information) 901.

In FIG. 10, the multi-cycle verification circuit 414 provides an undefined value signal in place of the signal in the multi-cycle part in the verification target circuit 402 depending on a control signal indicating valid or invalid of the signal in the multi-cycle part in the verification target circuit 402. For example, the control signal is the write enable signal FF2WE.

Further, in FIG. 10, the logic circuit in the verification target circuit 402 includes the second flip-flop 404 into which the signal S in the multi-cycle part and the write enable signal FF2WE are input.

If logical simulation without delay is to be performed, the design data of the verification target circuit 402 and the design data of the multi-cycle verification circuit 414 may be RTL design data or net list design data. However, it is preferable that the data is the RTL design data.

In aspects of the first to third embodiments, the verification of the logic circuit that operates as the multi-cycle path of N cycles can be performed by the simple method at the early stage of the circuit design. Further, in the clock synchronization logic circuit, it is possible to check whether a part defined as a multi-cycle path by the circuit designer can really be used as the multi cycle.

While aspects in accordance with the present invention have been described with reference to the specific embodiments, it is to be understood that the invention is not limited to the embodiments. That is, it is to be understood that various modifications may be employed without departing from the technical idea or the primary features of the invention.

What is claimed is:

1. A computer-implemented simulation method of performing a simulation of design data of a verification target circuit including a logic circuit that operates as a multi-cycle path of N cycles in synchronization with a clock signal, the computer comprising a processor and a storage device, the simulation method comprising:

generating via the processor design data of a multi-cycle verification circuit for selectively providing an undefined value signal in place of a signal in a multi-cycle part in the verification target circuit;

performing logical simulation, without delay, on the basis of design data of the verification target circuit and the design data of the multi-cycle verification circuit;

comparing the signal of the verification target circuit with a signal of an expected value in the verification target circuit in the logical simulation;

detecting a variation of the signal in the multi-cycle part in the verification target circuit; and providing the undefined value signal in place of the signal in the multi-cycle part in the verification target circuit with a number of cycles M that satisfies 1←M<N;

wherein generating design data of the multi-cycle verification circuit is based on multi-cycle part information in a timing constraint information file.

2. A non-transitory computer-readable recording medium that stores therein a simulation program for performing simulation of design data of a verification target circuit including a logic circuit that operates as a multi-cycle path of N cycles in synchronization with a clock signal, the simulation program causing a computer to execute:

a design data generation step of generating design data of a multi-cycle verification circuit for selectively providing an undefined value signal in place of a signal in a multi-cycle part in the verification target circuit;

a logical simulation step of performing logical simulation without delay on the basis of design data of the verification target circuit and the design data of the multi-cycle verification circuit;

a comparison step of comparing the signal of the verification target circuit with a signal of an expected value in the verification target circuit in the logical simulation;

a detection step for detecting a variation of the signal in the multi-cycle part in the verification target circuit; and a providing step for providing the undefined value signal in place of the signal in the multi-cycle part in the verification target circuit with a number of cycles M that satisfies $1 \leftarrow M < N$;

wherein generating design data of the multi-cycle verification circuit is based on multi-cycle part information in a timing constraint information file.

3. A computer-implemented simulation method of performing a simulation of design data of a verification target circuit including a logic circuit that operates as a multi-cycle path of N cycles in synchronization with a clock signal, the computer comprising a processor and a storage device, the simulation method comprising:

generating via the processor design data of a multi-cycle verification circuit for selectively providing an undefined value signal in place of a signal in a multi-cycle part in the verification target circuit;

performing logical simulation, without delay, on the basis of design data of the verification target circuit and the design data of the multi-cycle verification circuit;

comparing the signal of the verification target circuit with a signal of an expected value in the verification target circuit in the logical simulation;

detecting a variation of the signal in the multi-cycle part in the verification target circuit; and providing the undefined value signal in place of the signal in the multi-cycle part in the verification target circuit with a number of cycles M that satisfies $1 \leftarrow M < N$;

wherein providing the undefined value signal in place of the signal in the multi-cycle part in the verification target circuit depends on a control signal indicating whether the signal in the multi-cycle part in the verification target circuit is valid or invalid.

4. A non-transitory computer-readable recording medium that stores therein a simulation program for performing simulation of design data of a verification target circuit including a logic circuit that operates as a multi-cycle path of N cycles in synchronization with a clock signal, the simulation program causing a computer to execute:

a design data generation step of generating design data of a multi-cycle verification circuit for selectively providing an undefined value signal in place of a signal in a multi-cycle part in the verification target circuit;

a logical simulation step of performing logical simulation without delay on the basis of design data of the verification target circuit and the design data of the multi-cycle verification circuit;

a comparison step of comparing the signal of the verification target circuit with a signal of an expected value in the verification target circuit in the logical simulation;

a detection step for detecting a variation of the signal in the multi-cycle part in the verification target circuit; and a providing step for providing the undefined value signal in place of the signal in the multi-cycle part in the verification target circuit with a number of cycles M that satisfies $1 \leftarrow M < N$;

wherein providing the undefined value signal in place of the signal in the multi-cycle part in the verification target circuit depends on a control signal indicating whether the signal in the multi-cycle part in the verification target circuit is valid or invalid.

\* \* \* \* \*